United States Patent
Silverman et al.

(10) Patent No.: US 11,695,380 B2
(45) Date of Patent: *Jul. 4, 2023

(54) DYNAMIC AUTOMATIC GAIN CONTROLLER CONFIGURATION IN MULTIPLE INPUT AND MULTIPLE OUTPUT RECEIVERS

(71) Applicant: Cisco Technology, Inc., San Jose, CA (US)

(72) Inventors: Matthew A. Silverman, Shaker Heights, OH (US); Evgeny Yankevich, Beachwood, OH (US); John M. Swartz, Lithia, FL (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/654,717

(22) Filed: Mar. 14, 2022

(65) Prior Publication Data

US 2022/0200558 A1  Jun. 23, 2022

Related U.S. Application Data (63) Continuation of application No. 17/081,474, filed on Oct. 27, 2020, now Pat. No. 11,283,420.

(51) Int. Cl.
*H03G 3/30* (2006.01)
*H03G 3/00* (2006.01)
*H04W 28/02* (2009.01)
*H04B 1/10* (2006.01)

(52) U.S. Cl.
CPC ........... *H03G 3/3042* (2013.01); *H03G 3/001* (2013.01); *H04B 1/109* (2013.01); *H04W 28/0268* (2013.01)

(58) Field of Classification Search
CPC .... H03G 3/001; H03G 3/3036; H03G 3/3042; H03G 3/3078; H04B 1/109; H04W 28/0268

See application file for complete search history.

(56) References Cited

U.S. PATENT DOCUMENTS

| | | | |
|---|---|---|---|
| 4,190,803 A * | 2/1980 | Imamura | H04B 1/40 455/158.1 |
| 11,283,420 B1 * | 3/2022 | Silverman | H03G 3/3078 |
| 2008/0287066 A1 * | 11/2008 | Tandai | H04L 5/003 455/45 |

(Continued)

*Primary Examiner* — Nguyen T Vo (74) *Attorney, Agent, or Firm* — Patterson + Sheridan, LLP (57) ABSTRACT

Dynamic automatic gain controller configuration in multiple input and multiple output receivers is provided by monitoring a given section of wireless spectrum for higher-priority signals using a first antenna set associated with a first Automatic Gain Controller (AGC) set while concurrently monitoring the given section of wireless spectrum for wireless packet-based traffic using a second antenna set associated with a second AGC set; in response to detecting a packet via the second antenna set: re-associating the first antenna set and the second antenna set to a third AGC set; receiving the packet via the first antenna set and the second antenna set using the third AGC set; and in response to the packet being received, re-associating the first antenna set to the first AGC set and the second antenna set to the second AGC set.

20 Claims, 5 Drawing Sheets

(56) References Cited

U.S. PATENT DOCUMENTS

| | | | |
|---|---|---|---|
| 2011/0310883 A1* | 12/2011 | Takano | H04B 7/088 |
| | | | 370/350 |
| 2016/0233580 A1* | 8/2016 | Aparin | H03G 3/3052 |
| 2021/0119760 A1* | 4/2021 | Jiang | H04B 17/309 |

* cited by examiner

DYNAMIC AUTOMATIC GAIN CONTROLLER CONFIGURATION IN MULTIPLE INPUT AND MULTIPLE OUTPUT RECEIVERS

CROSS-REFERENCE TO RELATED APPLICATIONS

This application is a continuation of co-pending U.S. patent application Ser. No. 17/081,474 filed Oct. 27, 2020. The aforementioned related patent application is herein incorporated by reference in its entirety.

TECHNICAL FIELD

Embodiments presented in this disclosure generally relate to networking devices, such as Multiple Input and Multiple Output (MIMO) receivers. More specifically, embodiments disclosed herein provide for Automatic Gain Controller (AGC) configuration to enable the MIMO receivers to operate in portions of a wireless spectrum shared with higher-priority incumbent signaling devices.

BACKGROUND

In a wireless networking environment, signals are transmitted over the air at various frequencies. When multiple devices in range of one another seek to use the same or overlapping ranges of frequencies, spectrum can be allocated for use at different times by the different devices to avoid interference between the signals sent or received by those devices. In some cases, the devices competing for the same portion of the spectrum can collaborate with one another (e.g., via a wireless controller) to allocate different time slots for different devices to use the same portion of spectrum. However, the devices seeking to use the available spectrum may not be in communication with one another to schedule co-use of the shared spectrum or may have unequal rights to use the shared spectrum; forcing some devices to listen to the shared spectrum for the presence of higher-priority signals, and (temporarily) abandoning the shared spectrum when such higher-priory signals are detected.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a method, comprising: monitoring a given section of wireless spectrum for high-priority signals using a first antenna set associated with a first Automatic Gain Controller (AGC) set while concurrently monitoring the given section of wireless spectrum for wireless packet-based traffic using a second antenna set associated with a second AGC set; in response to detecting a packet via the second antenna set: re-associating the first antenna set and the second antenna set to a third AGC set; receiving the packet via the first antenna set and the second antenna set using the third AGC set; and in response to the packet being received, re-associating the first antenna set to the first AGC set and the second antenna set to the second AGC set.

One embodiment presented in this disclosure is a access point (AP) device, comprising: a first antenna set; a second antenna set; a first automatic gain controller (AGC) set configured for high-priority signal detection via the first antenna set; a second AGC set configured for low-priority signal detection via the second antenna set; a third AGC set configured for low-priority signal reception via both the first antenna set and the second antenna set; and an AGC selector configured to: associate the first antenna set with the first AGC set and associate the second antenna set with the second AGC set when in a listening state; and associate the first antenna set and the second antenna set with the third AGC set when in a receiving state; wherein the AGC selector transitions from the listening state from the receiving state in response to detecting reception of a packet; and wherein the AGC selector transitions from the receiving state to the listening state in response to detecting an end of the packet.

One embodiment presented in this disclosure is a computer readable storage device including instructions that, when executed by a processor, perform an operation, comprising: monitoring a given section of wireless spectrum for high-priority signals using a first antenna set associated with a first Automatic Gain Controller (AGC) set while concurrently monitoring the given section of wireless spectrum for wireless packet-based traffic using a second antenna set associated with a second AGC set; in response to detecting a packet via the second antenna set: re-associating the first antenna set and the second antenna set to a third AGC set; receiving the packet via the first antenna set and the second antenna set using the third AGC set; and in response to the packet being received, re-associating the first antenna set to the first AGC set and the second antenna set to the second AGC set.

Example Embodiments

The present disclosure provides for dynamic Automatic Gain Controller (AGC) configuration in Multiple Input and Multiple Output (MIMO) receivers to improve accuracy for detecting higher-priority signals and to streamline the signaling hardware used in the receiver device. Various wireless systems may have higher or lower priority to a given portion of a spectrum, where lower priority devices are expected to yield the use of that portion of spectrum when a higher priority device is using the spectrum. For example, in a Dynamic Frequency Selection (DFS) schema used by a WiFi Access Point (AP), the AP monitors the C band frequencies for incumbent systems also using those frequencies (e.g., radar, satellite communications, etc.) and switches communications out of the C band when an incumbent system is detected using those frequencies. In the current example, radar or satellite communications are non-limiting examples of higher-priority traffic relative to WiFi signals (e.g., IEEE 802.11), and the present disclosure can be applied in various embodiments with different signaling types designated as higher-priority or lower-priority.

One or more antennas are used to listen for higher-priority signals on the shared channels, and higher-priority signals are detected, the MIMO receiver device abandons (at least temporarily) any channels used by the higher-priority signaler. However, detecting that a high-priority system is using the portion of the spectrum can be inaccurate, leading to false positive detections that cause the MIMO receiver device to prematurely abandon the channels and reduce the bandwidth available to the device. In the present disclosure, a first set of antennas and a second set of antennas are used to concurrently monitor a shared portion of the wireless spectrum for different signal types (e.g., higher-priority and lower-priority signals), where a first set of AGCs and a second set of AGCs associated with the signaling characteristics of each signal type are used separately by each set of antennas.

To reduce the number of false positive detections of higher-priority signals, the MIMO receiver device uses several different AGC configurations or algorithms with the antenna set used to listen for higher-priority signals. Each AGC configuration independently identifies whether a higher-priority signal is detected, and the MIMO receiver device yields the channel once the AGC configurations are in concordance. Additionally, by re-assigning the antennas between use cases (e.g., listening for higher-priority signals, listening for lower-priority signals, interpreting lower-priority signals), the MIMO receiver device can devote more antennas to an individual operational state to further improve sensitivity and accuracy in detecting those signals.

Figure 1:
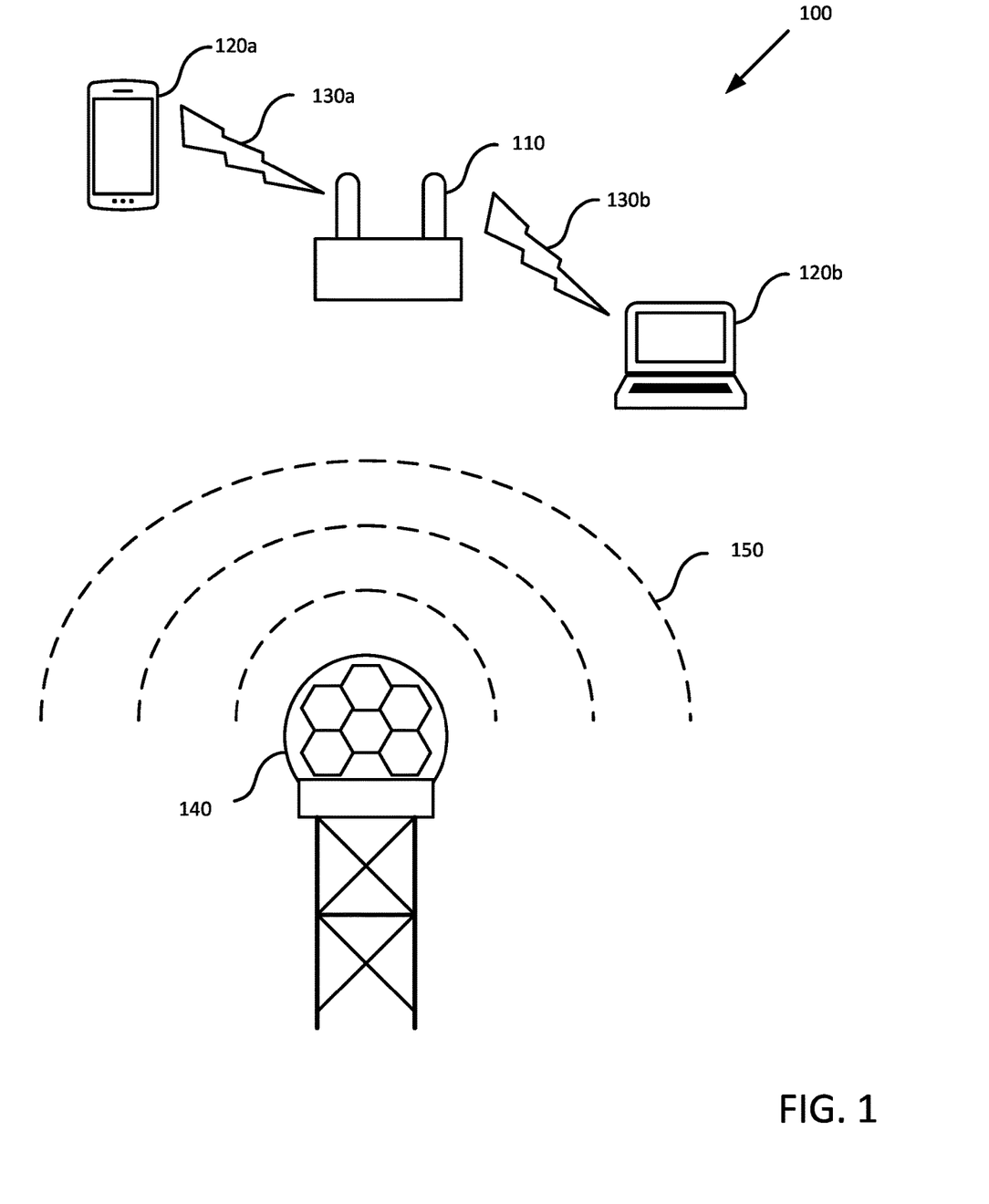
FIG. 1 illustrates a signaling environment, according to embodiments of the present disclosure.

FIG. 1 illustrates a signaling environment 100, according to embodiments of the present disclosure. In the illustrated signaling environment 100, an AP 110 manages a first wireless link 130a (generally or collectively wireless link 130) with a first station 120a (generally or collectively, station 120) and a second wireless link 130b with a second station 120b. Although one AP 110 and two stations 120 are shown in FIG. 1, in various embodiments, a wireless network can include more APs 110 and various numbers of stations 120. The AP 110 provides wireless connectivity between two or more stations 120 or between a given station 120 and another networking element (e.g., a wired link to an external network, a wireless bridge to another AP 110, etc.).

When a station 120 is associated with the AP 110, the AP 110 (sometimes in conjunction with a network controller associated with the AP 110) manages a wireless link 130 for communicating with that station 120. The corresponding wireless signals propagate through the air (and some intervening materials) to carry data between the AP 110 and the station 120. The wireless links 130 can be established between an AP 110 and a station 120 using various wireless standards (e.g., the IEEE 802.11 "WiFi" family of standards) that allow for certain portions of the spectrum to be used with various multiplexing schemes so that two or more devices can share the transmission medium. The AP 110 provides the various stations 120 with scheduled windows to send or receive communications on one or more designated channels and periodically updates the stations 120 with new windows/frequencies to use.

However, some portions of the wireless spectrum may be made conditionally available for use in the wireless links 130 based on whether incumbent devices 140 (using a different transmission standard than the AP 110) as using the shared spectrum. The incumbent devices 140 and the AP 110 may not be in bi-directional communication with one another, and the AP 110, due to having lower-priority to access the shared channel, has access to the shared channel subject to the incumbent device 140 not concurrently using the shared channel. Instead of sharing transmission schedules or negotiating for use of the shared channel, the AP 110 (as part of the wireless standard) abandons or yields those portions of the spectrum to higher-priority incumbent devices 140, allowing the incumbent device 140 full access to the shared channel for at least a given time period. For example, incumbent devices 140, such as a weather Doppler radar tower, use various portions of the spectrum that are also used for WiFi signaling (e.g., the 5 Gigahertz C-band). Accordingly, the AP 110 listens for incumbent signals 150 in the pattern used by the incumbent devices 140 to avoid generating interference for the incumbent device 140 or being interfered with by the incumbent device 140.

When the AP 110 detects an incumbent signal 150 having a higher-priority to a channel than the signals used by the AP 110, the AP 110 yields or abandons the channel. In various embodiments, the AP 110 avoids scheduling transmission windows that use frequencies occupied by the incumbent signal 150 (including any guard frequencies) to avoid generating interference in the shared channel. In some embodiments, the AP 110 and stations 120 wait out the incumbent signal 150 and resume use of the shared channel once the incumbent signal 150 (plus any guard periods) is no longer detected, while in other embodiments, the AP 110 assigns the stations 120 to different channels not used by the incumbent device 140.

For example, in response to detecting the incumbent signal 150 on a shared channel used by the first wireless link 130a, the AP 110 ceases communications over the first wireless link 130a for at least n seconds by not scheduling any transmission windows for the first station 120a for the time period, but resumes scheduling transmission windows once n seconds have elapsed. In another example, in response to detecting the incumbent signal 150 on a shared channel used by the first wireless link 130a, the AP 110 shifts the first wireless link 130a to a different and unoccupied channel to continue communication with the first station 120a while the incumbent signal 150 is still detected.

In various embodiments, wireless links 130 that are not in the shared channel used by the incumbent signal 150 can remain unaffected by the detection of an incumbent signal 150, or may also be shifted to accommodate an affected wireless link 130 shifting away from the channel shared with the incumbent signal 150. For example, if the AP 110 shifts the first wireless link 130a from a channel shared with the incumbent signal 150 to a channel shared with the second wireless link 130b, the AP 110 may introduce time division multiplexing between the wireless links 130a-b to allow co-use of the channel, shift the second wireless link 130b to a third channel, or the like.

Figure 2A:
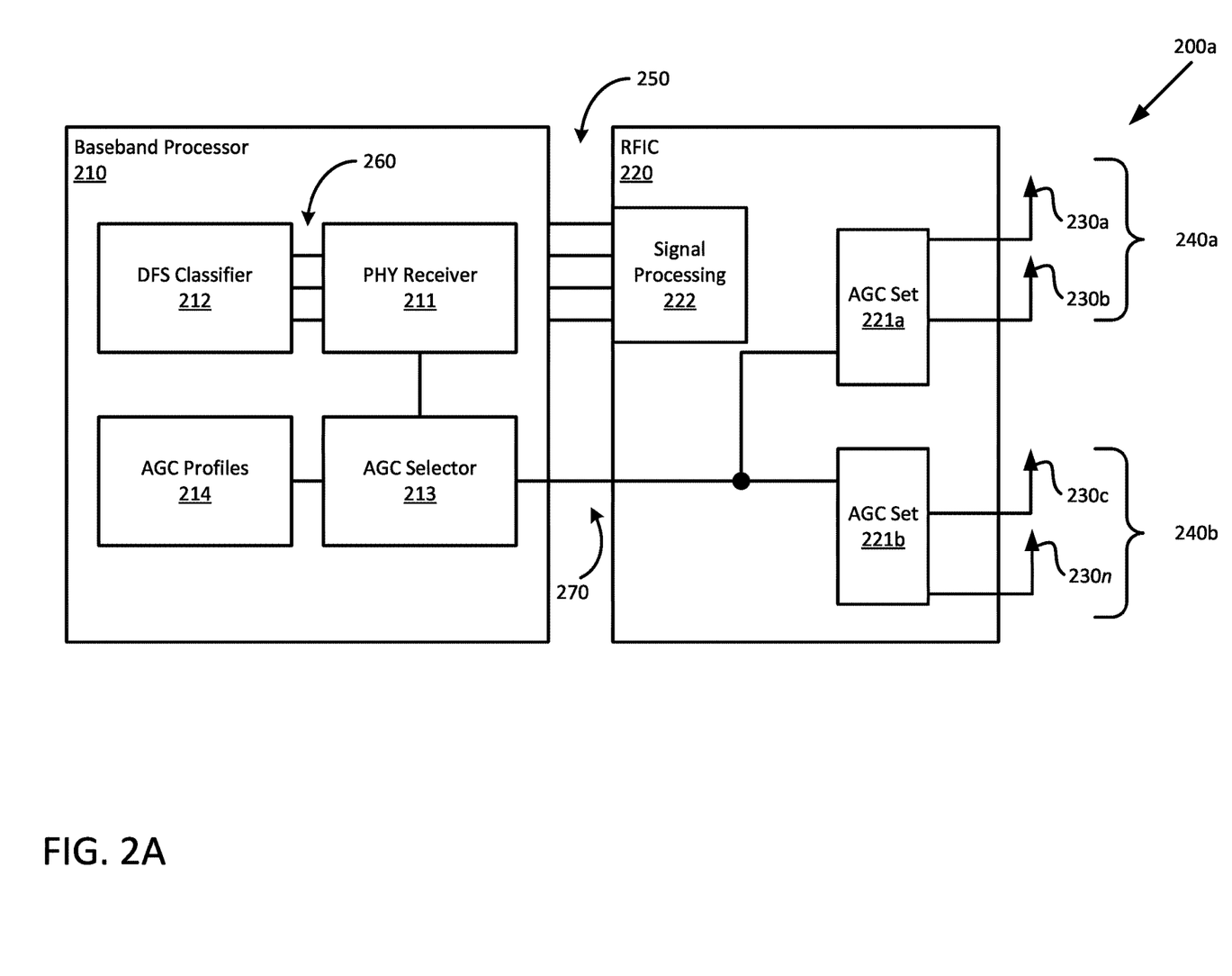
FIGS. 2A and 2B illustrate detailed views of an AP in a listening state and a receiving state, respectively, according to embodiments of the present disclosure.
Figure 2B:
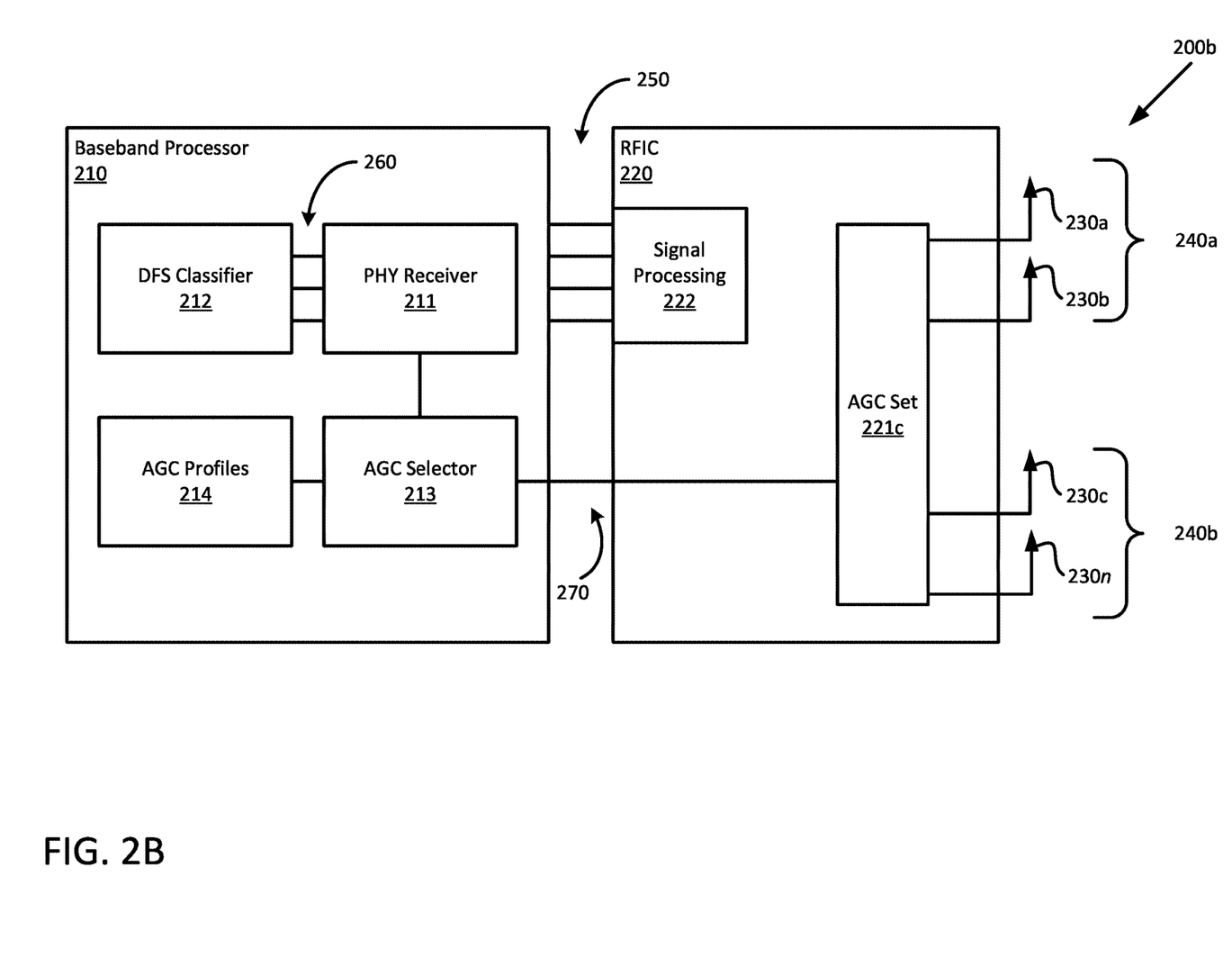

FIGS. 2A and 2B illustrate detailed views of an AP 110 in a listening state 200a and a receiving state 200b, respectively, according to embodiments of the present disclosure. That is, FIG. 2A illustrates a configuration of the AP 110 in the listening state 200a, while FIG. 2B illustrates the same AP 110 but when that AP 110 has switched to the receiving state 200b.

The AP 110 includes a baseband processor 210, a Radio Frequency Integrated Circuit (RFIC) 220, and a plurality of antennas 230a-n (generally or collectively, antennas 230). In one embodiment, the AP 110 is a MIMO device capable of receiving signals via the plurality of antennas 230a-n and cross-comparing the incoming signals to receive multiple variants of a transmission to form a single coherent understanding of the transmitted data (e.g., compensating for signal multi-pathing, using different encoding schemas, providing spatial multiplexing, etc.). Accordingly, each antenna 230 discussed FIGS. 2A and 2B are tuned for receiving Multiple Inputs for the AP 110 in a channel shared with incumbent signals 150. Although not illustrated, the AP 110 may include other antennas tuned for use in other channels than the channel shared with the incumbent signals 150.

The plurality of antennas 230a-n is generally separated into a first antenna set 240a (generally or collectively, antenna sets 240) and a second antenna set 240b. When in the listening state 200a (as illustrated in FIG. 2A), the first antenna set 240a is associated with a first AGC set 221a (generally or collectively, AGC sets 221) configured to detect high-priority signals (e.g., radar signaling) and the second antenna set 240b is associated with a second AGC set 221b configured to detect the lower-priority signals use by the AP 110 to communicate with associated stations 120. When in the receiving state 200b (as illustrated in FIG. 2B), the first antenna set 240a and the second antenna set 240b are both associated with a third AGC set 221c (shown in FIG. 2B) configured to interpret the inputs from the plurality of antennas 230a-n to receive and interpret wireless packet-based traffic.

The antennas 230, despite grouped into different antenna sets 240a-b, are tuned to receive signals in the same channels, but detect different signal types in the shared channel via the differently configured AGC sets 221 associated with the different antenna sets 240. When in the listening state 200a in FIG. 2A, the first antenna set 240a is connected to the first AGC set 221a to monitor the shared channel for higher-priority signals while the second antenna set 240b is connected to the second AGC set 221b to concurrently monitor the shared channel for lower-priority signals (e.g., packets in packet-based traffic). When in the receiving state 200b in FIG. 2B, the first and second antenna sets 240a-b are both connected to the shared third AGC set 221c and to coordinate packet interpretation in response to detecting an incoming packet. In various embodiments, the first AGC set 221a includes several different algorithms, configurations, or combinations thereof so that the several antennas 230 included in the first antenna set 240a provide for different analyses of the each associated antennas 230.

In various embodiments, the number of antennas 230 included in the first antenna set 240a is greater than the number of antennas 230 included in the second antennas set 240b, to improve the ability and diversity in analysis of the share channel for higher-priority signals. Accordingly, by combining the first antenna set 240a and the second antenna set 240b when in the receiving state 200b, and separating the antenna sets 240 in the listening state 200a, the AP 110 can deploy a greater number of antennas 230 (and AGC configurations) for detecting when a higher-priority signal occupies the shared channel, while putting those antennas 230 to use in interpreting packets in the lower-priority packet-based traffic. Additionally, by switching the AGC sets 221 that the antennas 230 are routed through, rather than tuning a AGC associated with each individual antenna 230, the AP 110 can more quickly change how signals received by the individual antennas 230 are interpreted by the baseband processor 210.

Once the RFIC 220 receives incoming signals and applies associated gains (via the active AGC set(s) 221), various signal processing elements 222 such as analog filters, multiplexers, mixers, etc., provide further processing to the received signals, and pass n (where n is the number of antennas 230) analog baseband I/O signals identifying the magnitude and phase of the processed signal to the baseband processor 210 over n paths 250.

The baseband processor 210 includes the physical layer (PHY) receivers 211 for handling and processing the n signals received from the RFIC 220, and provides m of the n signals to a DFS classifier 212 over m paths 260. The m signals carried over the m paths 260 correspond to the signals received from the first antenna set 240a (of m antennas 230) when in the listening state 200a. The DFS classifier 212 independently determines when the signal received from each of the antennas 230 listening for higher-priority signals has detected a higher-priority signal (whether falsely or positively) and determines an overall consensus from the set of m determinations. In some embodiments, consensus is reached when the m signals unanimously identify that a higher-priority signal has been detected, but other consensus models (e.g., at least a threshold fraction of m (simple majority, super majority), weighted averaging, etc.) can be used in other embodiments.

An AGC selector 213 determines how the AGCs in the AGC sets 221 are configured, based on stored AGC profiles 214 (specifying various configurations and algorithms for use in the AGCs) and which AGC sets 221 are active at any given time based on the determination made by the DFS classifier 212. The AGC selector 213 associates the first antenna set 240a with the first AGC set 221a and associates the second antenna set 240b with the second AGC set 221b when the AP 110 is in the listening state 200a according to the DFS classifier 212. Similarly, the AGC selector 213 associates the first antenna set 240a and the second antenna set 240b with third AGC set 221c when the AP 110 is in the receiving state 200b according to the DFS classifier 212.

The AP 110 transitions to between the listening state 200a and the receiving state 200b, with the AGC selector 213 accordingly disassociating and re-associating the antenna sets 240 with different AGC sets 221, based on the signals received by the antennas 230. For example, the AGC selector 213 transitions the AP 110 from the listening state 200a to the receiving state 200b in response to detecting reception of a packet via the second antenna set 240b listening for packet-based (lower-priority) signals. The AP 110 remains in the receiving state 220b until the packet is fully received, at which point the AGC selector 213 transitions the AP 110 from the receiving state 200b to the listening state 200a. Because the packet includes a length field in a header portion, the AP 110 knows when the packet is fully received and when to return to the listening state 200a from the receiving state 200b. In some embodiments, the AP 110 transitions to the receiving state 200b from the listening state 200a after receiving and interpreting all or part of the PHY preamble of the packet up until a second part of the preamble where a re-AGC and re-channel estimation can occur. The PHY preamble is received and interpreted using the second antenna set 240b and the second AGC set 221b. When transitioning to the receiving state 220b, the AP 110 transitions before the header is fully received, namely before the last opportunity in a packet to perform AGC operations and channel estimation. In other embodiments, when the header portion comprises the entirety of the packet (e.g., with legacy packets in the IEEE 802.11 family of standards), the AP 110 receives and interprets the packet while in the listening state 200a and remains in the listening state 220a as there is no further data to receive and interpret in the given packet after the header has been received.

Rather than re-tuning the AGC associated with each antenna 230 to switch between the listening state 200a and the receiving state 200b, the AGC selector 213 changes which AGCs are associated with the individual antennas 230. According, the AGCs in the second AGC set 221b and the third AGC set 221c are tuned to handle different numbers of physical inputs (n–m and n, respectively) but are both tuned to for interpreting a traffic-carrying signals for the AP 110. In contrast, the AGCs in the first AGC set 221a is tuned for detecting incumbent signals 150, and the AGC selector 213 may select a plurality of different AGC profiles 214 for use in the first AGC set 221a. The AGC selector 213 communicates which AGCs the antennas 230 are to use via an AGC control line 270 based on the current state that the AP 110 operated in.

When the AP 110 is in the listening state 200a and receives a higher-priority signal via the first antenna set 140a (e.g., a radar pulse, satellite signal, etc.), the AP 110 terminates communications in the shared channel. When abandoning the shared channel to terminate communications that would potentially interfere with the higher-priority signal, the AP 110 ceases downlink transmissions via the shared channel to any associated stations 120 assigned to the shared channel and does not assign any further time slots in the shared channel to those stations 120 (at least temporarily). In some embodiments, the AP 110 (via a different channel from the shared channel) explicitly instructs the associated stations 120 to also abandon the shared channel; reassigning some of all of the stations 120 to channels other than the shared channel.

Once the shared channel has been vacated for the required time duration, the DFS classifier allows the AP 110 to use the shared channel for uplink or downlink traffic with one or more stations again. In some embodiments, the DFS classifier 212 allows the AP 110 to returns to the shared channel after a guard period amount of time passes after consensus is lost that a higher-priority signal is detected (e.g., x minutes after losing consensus) to account for potential sequential series or pulses of high-priority signals from an incumbent device 140. Additionally, in some embodiments, after the guard period has expired, the AP 110 actively observes the shared channel for a confirmation period to perform a Channel Availability Check (CAC), which may require the AP 110 to actively not detect incumbent signals on the channel for a CAC period (e.g., for y minutes after the guard period is complete) to verify that the channel is available for use by lower-priority signals. In various embodiments, the consensus used to determine that the higher-priority signal is no longer detected may be different than or the same as the consensus used to determine that a higher-priority signal is detected.

Figure 3:
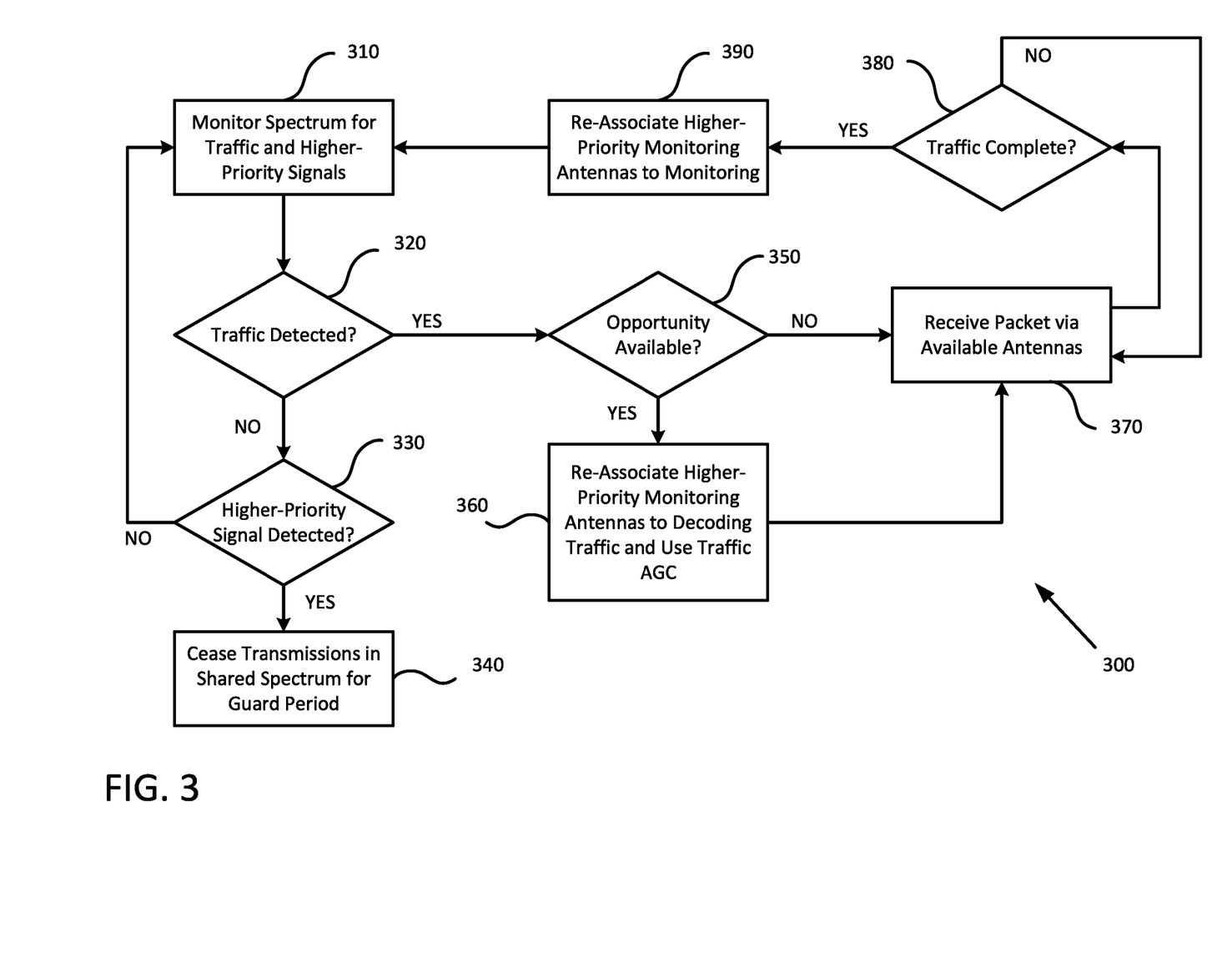
FIG. 3 is a flowchart of a method for dynamically configuring AGCs, according to embodiments of the present disclosure.

FIG. 3 is a flowchart of a method 300 for dynamically configuring AGCs, according to embodiments of the present disclosure. Method 300 begins at block 310, where an AP 110 monitors a spectrum, including one or more pre-defined ranges or channels within the available spectrum, for lower-priority traffic managed by the AP 110 and higher-priority traffic generated by incumbent devices 140 that the AP 110 is configured to yield to. The AP 110 monitors the given section of spectrum for higher-priority signals via a first antenna set 240a associated with a first AGC set 221a while concurrently monitoring the given section of spectrum for lower-priority wireless packet-based traffic via a second antenna set 240b associated with a second AGC set 221b. In various embodiments, each antenna 230 of the first antenna set 240a is connected to a uniquely configured AGC of the first AGC set 221a so that the signal received by each individual antenna 230 independently produces a unique determination of whether a high-priority signal has been detected. In various embodiments, the first antenna set 240a includes more antennas 230 than the second antennas set 240b.

At block 320, the AP 110 determines whether the second antenna set 240b has detected traffic for the AP 110 to handle (e.g., an incoming transmission from an associated station 120). When the AP 110 determines that the signals received by the second antenna set 240b, as processed by the second AGC set 221b, conform to a format used by the AP 110 to communicate with the stations 120 and is traffic for the given AP 110 to handle, method 300 proceeds to block 350. Depending on the communications standard used between the AP 110 and the stations 120, the AP 110 can use one or more of signal magnitude, Signal to Noise Ratio (SNR), format identification information in the signal (e.g., in a message header), or the like to determine whether the candidate signal received by the second antenna set 240b is a traffic-carrying signal for the AP 110 or something else (e.g., noise, a signal in a different standard, a signal for a different AP 110). Otherwise, when the signals received by the second antenna set 240b do not conform to the format used by the AP 110 to communicate with the stations 120 or are traffic handled by a different AP 110, method 300 proceeds to block 330.

At block 330, the AP 110 determines whether the first antenna set 240a has detected incumbent signals 150 on a channel that the AP 110 is sharing with an incumbent device 140. In various embodiments, the incumbent signal 150 can carry data (e.g., a data transmission in a standard with higher priority to the shared channel) or is used to gather data as a non-packet-based signal (e.g., detection and ranging via transmitted/reflected signals). Based on the characteristics of the signals received by the first antenna set 240a, as received via the first AGC set 221a, the DFS classifier 212 determines whether the received signals are actually incumbent signals 150, another format of signal that the AP 110 does not have to abandon the shared channel for (e.g., traffic from a rogue AP 110 or station 120), or merely noise in the channel. When the AP 110 determines that the signals received by the first antenna set 240a, as processed by the first AGC set 221a, conform to a format used by an incumbent device 140 that the given AP 110 should yield the channel to, method 300 proceeds to block 340. Otherwise, when the signals received by the first antenna set 240a do not conform to the format used by an incumbent device 140, method 300 returns to block 310 to continue monitoring the shared channel.

Depending on the communications standard used by the AP 110 and what incumbent devices 140 are co-located in the signaling environment 100, the AP 110 may fully or partially share one or more channels with various incumbent devices 140. Accordingly, the first AGC set 221a is configured, by the AGC selector 213, to apply one or more configurations or algorithms (collectively, profiles) to the received signals. In various embodiments, each antenna 230 of the first antenna set 240a is associated with a different AGC profile from the other antennas 230 in the first antenna set 240a based on the operating properties of incumbent devices 140 known to operate within the range of the AP 110. Each AGC profile thereby provides an independent (and potentially different) determination of whether the signal received by an individual antenna 230 in the first antenna set 240a is indicative of an incumbent signal 150. The DFS classifier 212 uses the several independent determinations to determine whether the determinations indicate a consensus for an incumbent signal 150 having been detected. In some embodiments, the DFS classifier 212 uses a unanimous consensus from the first antenna set 240a (e.g., performing a logical AND operation on the several independent determinations) to determine that an incumbent signal 150 has been detected, but the DFS classifier 212 can use other consensus thresholds (e.g., majority) in other embodiments.

In response to detecting an incumbent signal 150 per block 330, method 300 proceeds to block 340, where the AP 110 ceases transmissions in the shared channel for at least a guard period. The AP 110 may continue transmitting and receiving transmissions in other channels, but does send any signals in the shared channel until after the guard period concludes. In various embodiments, the AP 110 controls when the associated stations 120 are permitted to use the shared channel, and schedules the associated stations 120 to also cease transmitting in the shared channel for the guard period. Scheduling the associated stations 120 can include transitioning a station 120 to a different channel and continuing communications during the guard period, not scheduling future communication with the station 120 in the shared channel during the guard period, explicitly sending a cease-transmitting command to the station 120 to override a previously transmitted schedule that would allow the station 120 to use the shared channel during the guard period, and combinations thereof. Once the guard period has ended, method 300 returns from block 340 to block 310 to continue monitoring the shared channel.

The AP 110 may employ various guard periods to reduce interference with incumbent devices 140, but to also reduce the amount of time that the shared channel goes unused. In various embodiments, the guard period is a predefined period of time from the initial detection of an incumbent signal 150, a predefined period of time from the end of detecting an incumbent signal 150, or is based on a known signal generation or transmission pattern for an incumbent device 140. For example, when an incumbent device 140 of a satellite is known to use a series of three incumbent signals 150, the guard period can begin on detecting the first incumbent signal 150 and end a predefined amount of time after the third incumbent signal 150 is no longer detected rather than a predefined amount of time after the first incumbent signal 150 is detected (e.g., to account for different transmission times or variable inter-signal delays). In another example, when a ranging (outbound) signal from incumbent device 140 of a radar tower is detected, the guard period may end once the reflected (inbound) signal is detected or a predefined amount of time after the ranging signal is sent (e.g., when no reflected signal is expected). Other guard period formulations based on the signaling characteristics of the incumbent devices are also contemplated.

In response to detecting a packet per block 320, method 300 proceeds to block 350, where the AP 110 determines whether there is an opportunity available to switch one or more antennas from monitoring for higher-priority signals to decoding traffic. After traffic is detected, the AP 110 determines whether there is a Short Training Filed (STF) (e.g., High Throughput (HT), Very High Throughput (VHT), or High Efficiency (HE)) available to reassign an AGC for those antennas that were previously monitoring for higher-priority signals and whether there is a Long Training Field (LTF) (e.g., HT, VHT, or HE) available for redoing channel estimation so that all paths can be included in receiving the remainder of the packet. When both an STF and an LTF are available, (e.g., as will be the case for HT/VHT/HE format frames), then the AP 110 determines that the first antenna set 240a can join the second antenna set 240b in the traffic decoding process for the remainder of the packet, and method 300 proceeds to block 360. When there is not an opportunity provided to switch the antennas monitoring for higher-priority signals to decode the packet, method 300 proceeds to block 370 (remaining in the listening state 200a) to continue monitoring the shared channel with the first antenna set 240a and to decode the traffic using the second antenna set 240b.

At block 360, the AP 110 transitions from the listening state 200a to the receiving state 200b in response to detecting an opportunity to use the first antenna set 240a to decode packet that has not yet been fully received. When transitioning to the receiving state 220b, the AGC selector 213 re-disassociates the antenna sets 240 from the current AGC sets 221 used for detecting the higher-priority incumbent signals 150 or the lower-priority signals used by the AP 110 to communicate with the stations 120. Accordingly, the AGC selector 213 re-associates the first antenna set 240a and the second antenna set 240b to a third AGC set 221c configured to receive the incoming packet using a greater number of antennas 230 than included in the second antenna set 240b.

At block 370, where the AP 110 receives the rest of the packet via the via the available antennas. When in the listening state (having proceeded from block 350 to block 370), the second antenna set 240b is available to decode the traffic via the second AGC set 221b. When in the receiving state (having performed block 360), the first antenna set 240a and the second antenna set 240b are available to decode the traffic via the third AGC set 221c. In various embodiments, the second antenna set 240b includes fewer antennas 230 than the first antenna set 240a includes to allow for more accurate and nuanced detection of potential incumbent signals 150 than using a smaller set of dedicated incumbent-signal-detecting antennas, but also providing for re-use of the antennas 230 in the first antenna set 240a when a non-incumbent signal address to the AP 110 is received. The AP 110 is thereby enabled to use all of the appropriately tuned antennas 230a-n to receive the remainder of the packet, thus providing greater accuracy and nuance in packet reception, lower hardware overhead, faster switching time compared to reconfiguring the AGCs, and combinations thereof.

Method 300 proceeds to block 380 from block 370, where the AP 110 determines whether the packet has been fully received. The packets making up the traffic are of a known size, either based on the communications standard used by the AP 110 or through a length field in the packet indicating the length thereof. In various embodiments, the amount of data received by the second antenna set 240b by the time the AP 110 determines that a packet has been received may include the entire transmission or only a portion of the packet. For example, the AP 110 may wait to determine if a header section of a packet has been received before determining that a packet destined for the AP 110 has actually be received (e.g., versus noise or a packet destined for a different device), and when the header comprises the entirety of the packet, the AP 110 determines that the packet has been fully received. When the traffic is complete, method 300 proceeds to block 390, otherwise method 300 returns to block 370 to continue receiving and decoding the packet via the available antennas.

At block 390, in response to the packet being fully received, the AGC selector 213 transitions the AP 110 back from the receiving state 200b to the listening state 200a by re-associating the antennas 230 to the monitoring AGCs. Accordingly, the AGC selector 2130 disassociates the first and second antenna sets 240a-b from the third AGC set 221c and re-associated the first antenna set 240a to the first AGC set 221a and the second antenna set 240b to the second AGC set 221b. Method 300 then returns to block 310 to continue monitoring the shared channel.

Figure 4:
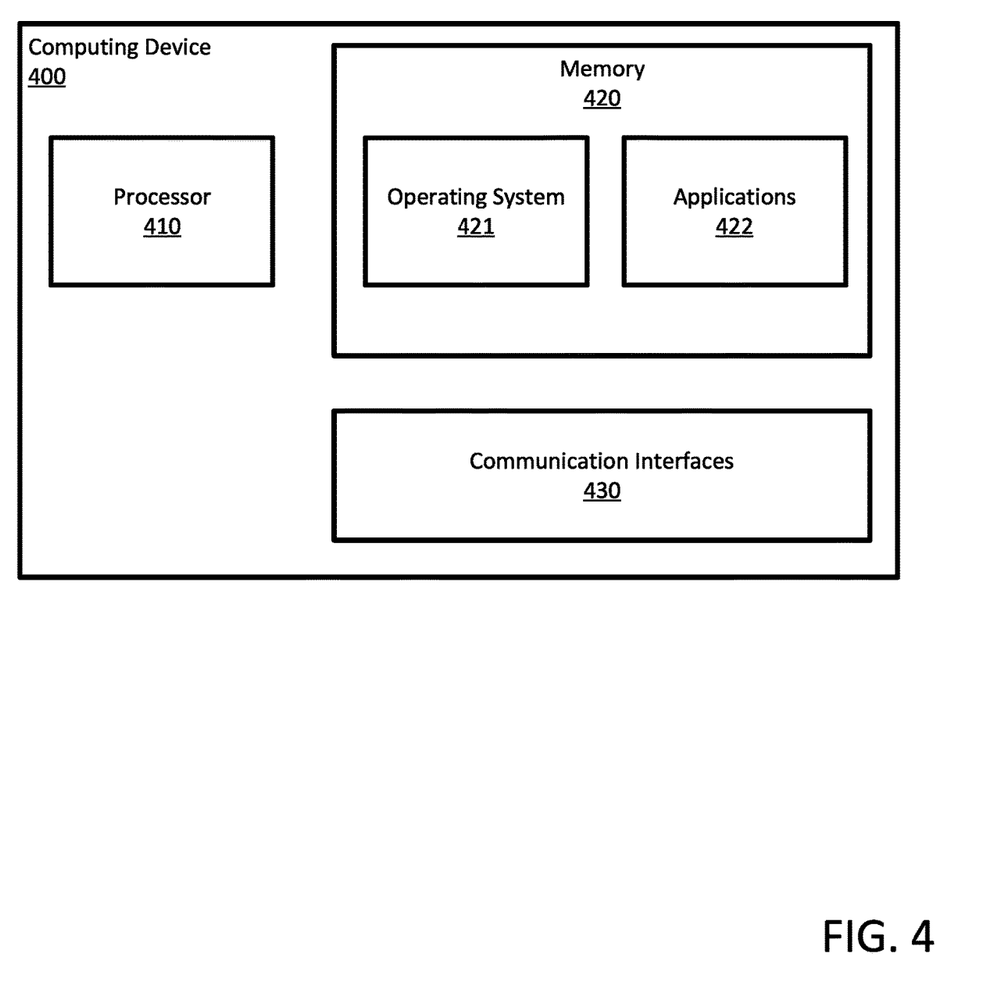
FIG. 4 illustrates hardware of a computing device, according to embodiments of the present disclosure.

FIG. 4 illustrates hardware of a computing device 400 such as can be included in an AP 110, station 120, or incumbent device 140 as described herein. The computing device 400 includes a processor 410, a memory 420, and communication interfaces 430. The processor 410 may be any processing element capable of performing the functions described herein. The processor 410 represents a single processor, multiple processors, a processor with multiple cores, and combinations thereof. The communication interfaces 430 facilitate communications between the computing device 400 and other devices. The communication interfaces 430 are representative of wireless communications antennas and various wired communication ports including out-pins and in-pins to a microcontroller. The memory 420 may be either volatile or non-volatile memory and may include RAM, flash, cache, disk drives, and other computer readable memory storage devices. Although shown as a single entity, the memory 420 may be divided into different memory storage elements such as RAM and one or more hard disk drives.

As shown, the memory 420 includes various instructions that are executable by the processor 410 to provide an operating system 421 to manage various functions of the computing device 400 and one or more applications 422 to provide various functionalities to users of the computing device 400, which include one or more of the functions and functionalities described in the present disclosure. When provided as part of a AP 110, the memory 420 (and/or the applications 422) may include store various algorithms and configurations available for use in dynamically configuring an AGC.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product.

Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method, comprising:
   monitoring, in a listening state of a Multiple Input and Multiple Output (MIMO) device, a given section of wireless spectrum for higher-priority signals using a first antenna set associated with a first Automatic Gain Controller (AGC) set while concurrently monitoring the given section of wireless spectrum for wireless packet-based traffic using a second antenna set associated with a second AGC set; and
   in response to detecting a packet via the second antenna set, receiving, in a receiving state of the MIMO device, the packet via the first antenna set and the second antenna set using a third AGC set.

2. The method of claim 1, wherein the method further comprises:
   in response to detecting the packet via the second antenna set:
     re-associating the first antenna set and the second antenna set to the third AGC set; and
     in response to the packet being received, re-associating the first antenna set to the first AGC set and the second antenna set to the second AGC set.

3. The method of claim 1, wherein the higher-priority signals include incumbent non-packet-based signals using the given section of spectrum, and wherein the method further comprises:
   in response to detecting a higher-priority signal using the first antenna set, scheduling associated stations to cease transmitting in the given section of spectrum for a guard period.

4. The method of claim 1, wherein each antenna of the first antenna set is associated with one AGC of the first AGC set with a configuration unique from other AGCs of the first AGC set, wherein each AGC of the first AGC set produces a determination of whether a higher-priority signal has been detected independently of the other AGCs of the first AGC set.

5. The method of claim 1, wherein monitoring the given section of spectrum for the wireless packet-based traffic includes determining that a header section has been received by the second antenna set, wherein the first antenna set and the second antenna set are re-associated to the third AGC set after the header section has been fully received.

6. The method of claim 5, further comprising:
   in response to detecting a second packet via the second antenna set and determining that the header section indicates that the second packet is fully received once the header section has been fully received, leaving the first antenna set associated with the first AGC set and the second antenna set associated with the second AGC set.

7. The method of claim 1, wherein the first antenna set includes more antennas than the second antenna set.

8. A Multiple Input and Multiple Output (MIMO) access point (AP) device, comprising:
   a first antenna set;
   a second antenna set;
   a first automatic gain controller (AGC) set configured for higher-priority signal detection via the first antenna set;
   a second AGC set configured for low-priority signal detection via the second antenna set;
   a third AGC set configured for low-priority signal reception via both the first antenna set and the second antenna set; and
   an AGC selector configured to:
     monitor, in a listening state of the MIMO AP device, a given section of wireless spectrum for higher-priority signals using the first antenna set associated with the first AGC set while concurrently monitoring the given section of wireless spectrum for wireless packet-based traffic using the second antenna set associated with the second AGC set; and
     in response to detecting a packet via the second antenna set, receive, in a receiving state of the MIMO AP device, the packet via the first antenna set and the second antenna set using the third AGC set.

9. The MIMO AP device of claim 8, wherein the second AGC set and the third AGC set are tuned to handle different numbers of physical inputs from one another and are tuned to detect different signal formats from the first AGC set.

10. The MIMO AP device of claim 8, wherein the AGC selector determines to transition from the listening state to the receiving state based on header information included in the packet, and remains in the listening state when the packet is completely received via the header information.

11. The MIMO AP device of claim 8, wherein the first antenna set and the second antenna set are tuned to receive signals on a shared channel.

12. The MIMO AP device of claim 11, wherein the first AGC set is associated with a corresponding plurality of different configurations, and in response to determining via consensus of the plurality of different configurations that a radar signal is detected via the first antenna set, terminating packet-based transmissions between the AP device and associated stations over the shared channel.

13. The MIMO AP device of claim 12, wherein in response to determining via consensus of the plurality of different configurations that the radar signal is no longer detected via the first antenna set, resuming the packet-based transmissions between the AP device and the associated stations over the shared channel.

14. A non-transitory computer readable storage device including instructions that, when executed by a processor, perform an operation, comprising:
   monitoring, in a listening state of a Multiple Input and Multiple Output (MIMO) device, a given section of wireless spectrum for higher-priority signals using a first antenna set associated with a first Automatic Gain Controller (AGC) set while concurrently monitoring the given section of wireless spectrum for wireless packet-based traffic using a second antenna set associated with a second AGC set; and in response to detecting a packet via the second antenna set, receiving, in a receiving state of a Multiple Input and Multiple Output (MIMO) device, the packet via the first antenna set and the second antenna set using a third AGC set.

15. The computer readable storage device of claim 14, wherein the operation further comprises:

in response to detecting the packet via the second antenna set:

re-associating the first antenna set and the second antenna set to the third AGC set; and in response to the packet being received, re-associating the first antenna set to the first AGC set and the second antenna set to the second AGC set.

16. The computer readable storage device of claim 14, wherein the higher-priority signals include incumbent non-packet-based signals using the given section of spectrum, and wherein the operation further comprises:

in response to detecting a higher-priority signal using the first antenna set, scheduling associated stations to cease transmitting in the given section of spectrum for a guard period.

17. The computer readable storage device of claim 14, wherein each antenna of the first antenna set is associated with one AGC of the first AGC set with a configuration unique from other AGCs of the first AGC set, wherein each AGC of the first AGC set produces a determination of whether a higher-priority signal has been detected independently of the other AGCs of the first AGC set.

18. The computer readable storage device of claim 14, wherein monitoring the given section of spectrum for the wireless packet-based traffic includes determining that a header section has been received by the second antenna set, wherein the first antenna set and the second antenna set are re-associated to the third AGC set after the header section has been fully received.

19. The computer readable storage device of claim 18, wherein the operation further comprises:

in response to detecting a second packet via the second antenna set and determining that the header section indicates that the second packet is fully received once the header section has been fully received, leaving the first antenna set associated with the first AGC set and the second antenna set associated with the second AGC set.

20. The computer readable storage device of claim 14, wherein the first antenna set includes more antennas than the second antenna set.

* * * * *